US 6,678,852 B2

(12) United States Patent
Tsuto

(10) Patent No.: US 6,678,852 B2
(45) Date of Patent: Jan. 13, 2004

(54) SEMICONDUCTOR DEVICE TESTING APPARATUS

(75) Inventor: Masaru Tsuto, Tokyo (JP)

(73) Assignee: Advantest Corporation, Tokyo (JP)

( * ) Notice: Subject to any disclaimer, the term of this patent is extended or adjusted under 35 U.S.C. 154(b) by 337 days.

(21) Appl. No.: 09/865,811

(22) Filed: May 23, 2001

(65) Prior Publication Data
US 2001/0047500 A1 Nov. 29, 2001

(30) Foreign Application Priority Data
May 24, 2000 (JP) .................................... 2000-152496

(51) Int. Cl.⁷ .............................................. G01R 31/28
(52) U.S. Cl. ...................................... 714/738; 714/733
(58) Field of Search ................................ 714/728, 736, 714/738, 733; 324/765, 532, 158.1

(56) References Cited

U.S. PATENT DOCUMENTS

| 4,414,665 | A |   | 11/1983 | Kimura et al. |         |
|-----------|---|---|---------|---------------|---------|
| 4,893,072 | A | * | 1/1990  | Matsumoto     | 714/728 |
| 6,219,813 | B1| * | 4/2001  | Bishop et al. | 714/736 |
| 6,369,601 | B1| * | 4/2002  | Ishigaki      | 324/765 |
| 6,469,514 | B2| * | 10/2002 | Okayasu       | 324/532 |
| 6,479,983 | B1| * | 11/2002 | Ebiya         | 324/158.1|

FOREIGN PATENT DOCUMENTS

KR           703431         3/1998

* cited by examiner

Primary Examiner—David Ton
(74) Attorney, Agent, or Firm—David N. Lathrop, Esq.; Gallagher & Lathrop

(57) ABSTRACT

An address signal, a device control signal and a test pattern data outputted from a pattern generating part are applied to a semiconductor device under test, a response output signal from the semiconductor device under test is compared by a logical comparison part with an expected value data outputted from the pattern generating part, and the logical comparison part generates upon detection of a discordance in the comparison result a failure data representing a failure memory cell, which data is stored together with the address signal, the device control signal and the expected value data outputted from the pattern generating part in a data failure memory, wherein a variable delay part that can give arbitrary time delays to the address signal, the expected value data, and the device control signal, respectively is provided on a data transmission path connecting the pattern generating part to the data failure memory.

5 Claims, 5 Drawing Sheets

SEMICONDUCTOR DEVICE TESTING APPARATUS

BACKGROUND OF THE INVENTION

1. Field of the Invention

The present invention relates to a semiconductor device testing apparatus for testing, for example, various semiconductor devices such as semiconductor memories or logic ICs with memories mounted.

2. Description of the Related Art

FIG. 4 shows an outline of a conventional semiconductor device testing apparatus. FIG. 4 shows a configuration depicted by paying an attention only to signal paths in the testing apparatus. A pattern generating part 11 outputs signals or data such as an X address signal XAD, a Y address signal YAD, first and second device control signals MUS1 and MUS2, a test pattern data TP containing an expected value data EX, and the like which are to be applied to a semiconductor device under test 10.

A programmable data selecting part 12 classifies those signals or data in accordance with specifications of each pin of the semiconductor device under test 10, and allocates those signals to corresponding channels in the semiconductor device testing apparatus.

An input signal cycle delaying part 13 gives each signal a delay that agrees with the specifications of each input pin of the semiconductor device under test 10, and further adjusts its voltage level and pulse width in accordance with the specification conditions to supply the delayed and adjusted signal to the semiconductor device under test 10 as an input signal SIN.

On the other hand, an expected value data EX allocated to an expected value data channel by the programmable data selecting part 12 is supplied to a logical comparison part 15 through an expected value data transmission path 17 as an expected value data EX after a delay that agrees with output specifications of the semiconductor device under test 10 is given thereto by an expected value data cycle delaying part 14.

The logical comparison part 15 compares a response output signal SOUT outputted from the semiconductor device under test 10 with an expected value data EX given through the expected value data transmission path 17. When a discordance occurs in the comparison, for example, a logical "1" representing a failure is set in a bit position where the discordance occurred, and failure data FL 10, FL11, FL12, - - - each being able to specify a failure cell position based on this failure bit position are outputted from the logical comparison part 15.

Each of the failure data FL10, FL11, FL12, - - - is inputted to a data failure memory 16, and the data failure memory 16 is switched to writing mode by the input of each of the failure data FL10, FL11, FL12, - - - . An X address signal XAD, a Y address signal YAD, first and second device control signals MUS1 and MUS2, and a test pattern data TP containing an expected value data EX outputted from the pattern generating part 11 at a time point when each of the failure data FL10, FL11, FL12, - - - is generated are acquired and stored in the data failure memory 16 via a data transmission path 18 without any time delay.

Here, types of failure memories to be mounted in a semiconductor device testing apparatus will briefly be explained below. There are two types of failure memories each being to be mounted in a semiconductor device testing apparatus. One of the two types is an address failure memory that has the same address area as that of the semiconductor device under test, and the other is a data failure memory that stores therein failure data, address data, and test pattern data.

An address failure memory requires a large memory capacity since it has the same address area as that of the semiconductor device under test. That is, memory capacity is becoming larger and larger every year, and if the number of semiconductor devices tested at the same time becomes larger from, for example, current 32 to 64 or 128 etc., there is a drawback, in an address failure memory, that the same number of failure memories as the number of semiconductor devices under test must be mounted on a testing apparatus, and therefore the cost of the mounted failure memories becomes extremely high.

On the contrary, if the number of failure occurrences is small, failure memory capacity of a data failure memory may be small. Therefore, in order to provide a less expensive semiconductor device testing apparatus, a semiconductor device testing apparatus of a type on which a data failure memory 16 is mounted is advantageous.

From such a background, a semiconductor device testing apparatus on which a data failure memory is mounted is used in many cases. However, data to be stored in the data failure memory 16 are an X address signal XAD, an Y address signal YAD, a test pattern data TP, and the like outputted from the pattern generating part 11 at a time when a failure is detected. Therefore, since an address where a failure occurred, a test cycle when a failure occurred, or the like are to be estimated from these data, there is a drawback that it takes a longer time and more workload for a failure analysis.

This situation will be explained below using FIG. 5. The indication A in FIG. 5 shows an X address signal XAD, an Y address signal YAD, a test pattern data TP, and first and second device control signals MUS1 and MUS2 outputted from the pattern generating part 11.

An X address signal XAD outputted from the pattern generating part 11 is supplied to the semiconductor device under test 10 as a row address signal ROW1, and a Y address signal YAD is supplied to the semiconductor device under test 10 as one of column address signals COL10, COL11, COL12, COL13, - - - .

In addition, in this example, there is shown a case where a read command READ is applied, as the second device control signal MUS2, to each of four addresses (ROW1, COL10; ROW1, COL11; ROW1, COL12; ROW1, COL13) to be accessed by the row address ROW1 and the column addresses COL10–COL13. Further, as the first device control signal MUS1, is applied a control signal ACT for directing the semiconductor device under test 10 to acquire a row address. In addition, EX10, EX11, EX12, EX13, - - - are expected value data that are logically compared respectively with response output signals RD10, RD11, RD12, RD13, - - - (refer to FIG. 5B) outputted from the semiconductor device under test 10 in accordance with the read command READ.

Those signals outputted from the pattern generating part 11 are delayed, if each of their output timings (t=0) is referred to as an initial timing of each signal, by the input signal cycle delaying part 13 and the expected value data cycle delaying part 14 shown in FIG. 4 to the state shown in B and C of FIG. 5, and are inputted to the semiconductor device under test 10 and the logical comparison part 15 through their corresponding transmission paths.

That is, each of the address signals COL10, COL11, COL12, COL13, - - - to be applied to the semiconductor device under test 10 is delayed by two test cycles (t=2τ) from its initial timing (t=0) at which the corresponding row address signal ROW1 is applied, and then is supplied to the semiconductor device under test 10. This time delay is determined by a characteristic of the semiconductor device under test 10. Moreover, there is shown a case in which each of the read command signals READ is also delayed by two test cycles, and is applied to the semiconductor device under test 10.

In addition, in this example, there is shown a case in which each of the response output signals RD10, RD11, RD12, RD13, - - - of the semiconductor device under test 10 is delayed by three test cycles from a timing at which the corresponding read command signal READ is applied, and is outputted (refer to B of FIG. 5).

Therefore, each of the response output signals RD10, RD11, RD12, RD13, - - - is outputted at a timing delayed by five test cycles (t=5τ) from its output initial timing of the pattern generating part 11.

For this reason, each of the expected value data EX10, EX11, EX12, EX13, - - - is applied to the logical comparison part 15, as shown in C of FIG. 5, at a timing delayed by the expected value data cycle delaying part 14 by five test cycles from its initial timing, and is logically compared with corresponding one of the read data RD10, RD11, RD12, RD13, - - - . FL10, FL11, FL12, FL13, - - - shown in C of FIG. 5 represent failure data that are created due to the discordances in the respective comparisons.

D of FIG. 5 shows timings of the respective data being inputted to the data failure memory 16. According to the configuration of the semiconductor device testing apparatus shown in FIG. 4, an X address signal XAD, a Y address signal YAD, a test pattern data TP, and first and second device control signals MUS1 and MUS2 are inputted to the data failure memory 16 without being delayed. Therefore, at the timing when each of the failure data FL10, FL11, FL12, FL13, - - - is generated, a data generated from the pattern generating part 11 after five test cycles from each corresponding initial timing is acquired and stored in the data failure memory 16.

As apparent from D of FIG. 5, the cycle of the data generated from the pattern generating part 11 does not accord with the cycle of the failure data at the data failure memory.

Therefore, in the case of performing a conventional failure analysis, a series of pattern sequences that is stored in the pattern generating part 11 and is outputted therefrom in synchronism with test cycles must be referred, and a data leading by five test cycles from the failure data being analyzed must be searched in the data stored in the data failure memory 16 to estimate the address where the failure occurred and the pattern data by which the failure was detected. Therefore, in this case, there is a drawback that much more workload and longer time are spent.

In addition, there are two methods of failure analysis, i.e., (1) to perform a failure analysis by specifying an address where a failure occurred, a data read out from the address where the failure occurred, and an expected value used for the comparison, or (2) to perform a failure cause analysis by specifying addresses and device control signals which have been actually applied to the semiconductor device under test until a time when a failure occurs and expected values which have been applied to the logical comparison part until the time when the failure occurs. Since the reference position in the pattern series (a test cycle position to be referred) is different depending on which method of the (1) and (2) is used for the failure analysis, the work is very cumbersome.

BRIEF SUMMARY OF THE INVENTION

It is an object of the present invention to provide a semiconductor device testing apparatus in which a data stored in the data failure memory can be used as the right data to be obtained even in either case of the failure analysis methods.

In order to achieve this object, the semiconductor device testing apparatus according to the present invention includes a variable delay part that gives a delay of arbitrary cycles to a data from the pattern generator to be stored in the data failure memory to thereby supply the delayed data to the data failure memory.

As a first configuration of the present invention, in a semiconductor device testing apparatus of a type having a configuration that an address signal, a device control signal and a test pattern data outputted from a pattern generating part are applied to a semiconductor device under test, a response output signal from the semiconductor device under test is compared by a logical comparison part with an expected value data outputted from the pattern generating part, and at a time when a discordance occurs in the comparison result, an address signal, a test pattern data containing an expected value data, and device control signals outputted from the pattern generating part at that time are stored in a data failure memory together with a failure data representing a failure cell position, there is proposed a semiconductor device testing apparatus wherein a variable delay part is provided on a data transmission path connecting the pattern generating part to the data failure memory, based on a delay time set in the variable delay part, an arbitrary delay is given to each of the address signal, the test pattern data containing the expected value data and the device control signals outputted from the pattern generating part at the time the discordance occurs, and those data thus delayed can be stored in the data failure memory.

As a second configuration of the present invention, in the semiconductor device testing apparatus having the first configuration, there is proposed a semiconductor device testing apparatus having a configuration that based on the delay time set in the variable delay part, an address data representing a failure memory cell of the semiconductor device under test where the failure occurred, a test pattern data applied to the address where the failure occurred, and an expected value data to be compared with a response output data of the address where the failure occurred are stored in the same address of the data failure memory for storing a failure data.

As a third configuration of the present invention, in the semiconductor device testing apparatus having the first configuration, there is proposed a semiconductor device testing apparatus having a configuration that based on the delay time set in the variable delay part, address signals having been applied to the semiconductor device under test until a time when a failure occurs, and expected value data having been applied to the logical comparison part until the time when the failure occurs are stored in the data failure memory.

According to the semiconductor device testing apparatus of the present invention, a timing of a data to be stored in the data failure memory at a time of a failure occurrence can arbitrarily be selected by appropriately setting a delay time of the variable delay part.

As a result, when a test pattern actually applied to an address of a semiconductor device under test where a failure occurred and the corresponding response output are read out, the response output data can be stored in the data failure memory in correlation to an expected value data which is to be compared. In addition, at a time point when a failure occurs, an address signal currently being applied to the semiconductor device under test and an expected value data being applied to the logical comparison part can be stored in the same address of the data failure memory.

Therefore, at a time of failure analysis, a test pattern applied to an address where a failure occurred or the state of an address signal and a device control signal applied to the semiconductor device under test at a failure occurrence time can immediately be read out from the data failure memory. Consequently, there is obtained an advantage that the workload required for a failure analysis can greatly be reduced.

DETAILED DESCRIPTION OF THE INVENTION

Figure 1:
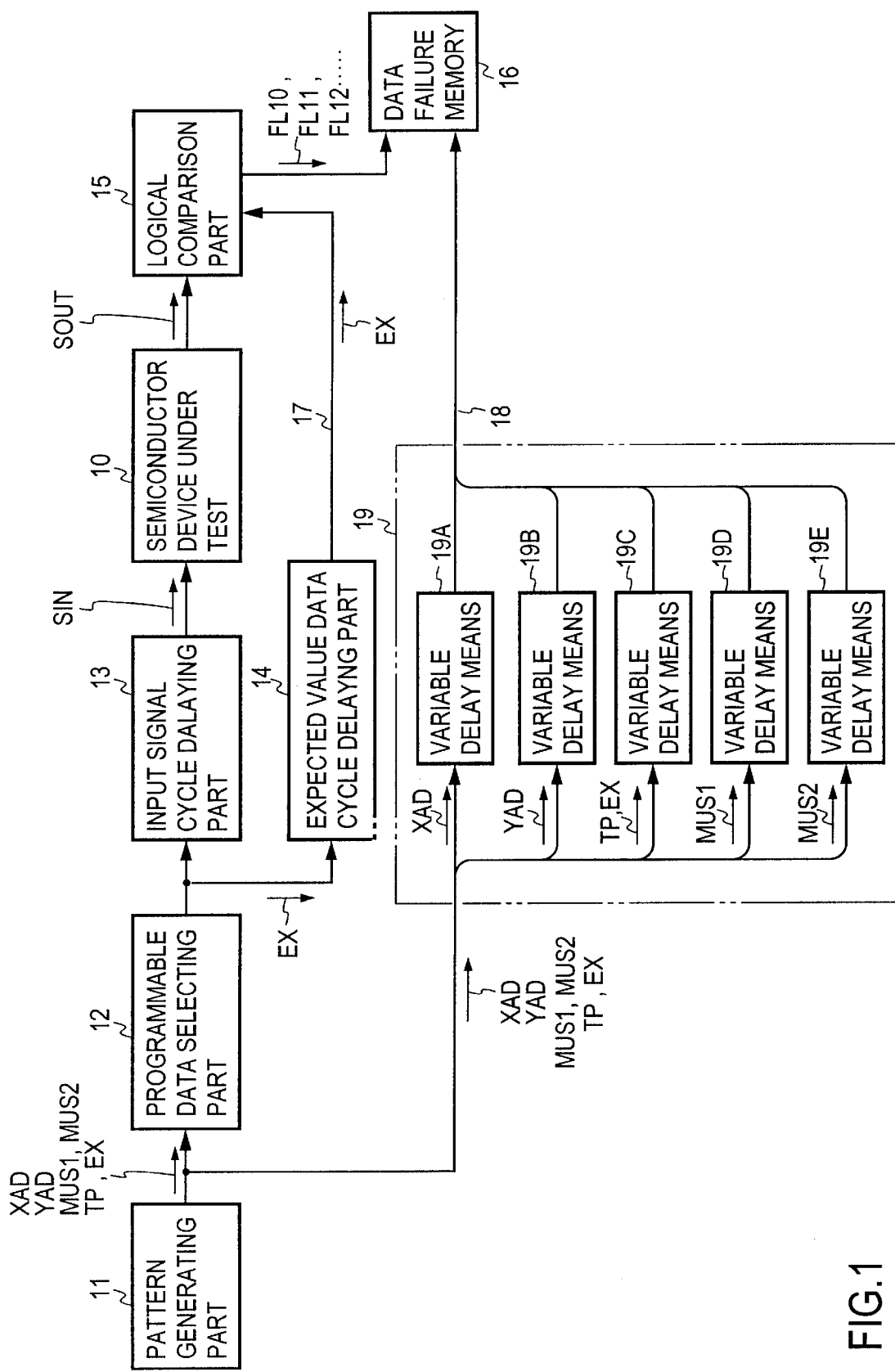
FIG. 1 is a block diagram for explaining an embodiment of a semiconductor device testing apparatus according to the present invention.

FIG. 1 shows an embodiment of a semiconductor device testing apparatus according to the present invention. Portions in FIG. 1 corresponding to those in FIG. 4 have the same reference signs affixed thereto as those in FIG. 4.

Figure 4:
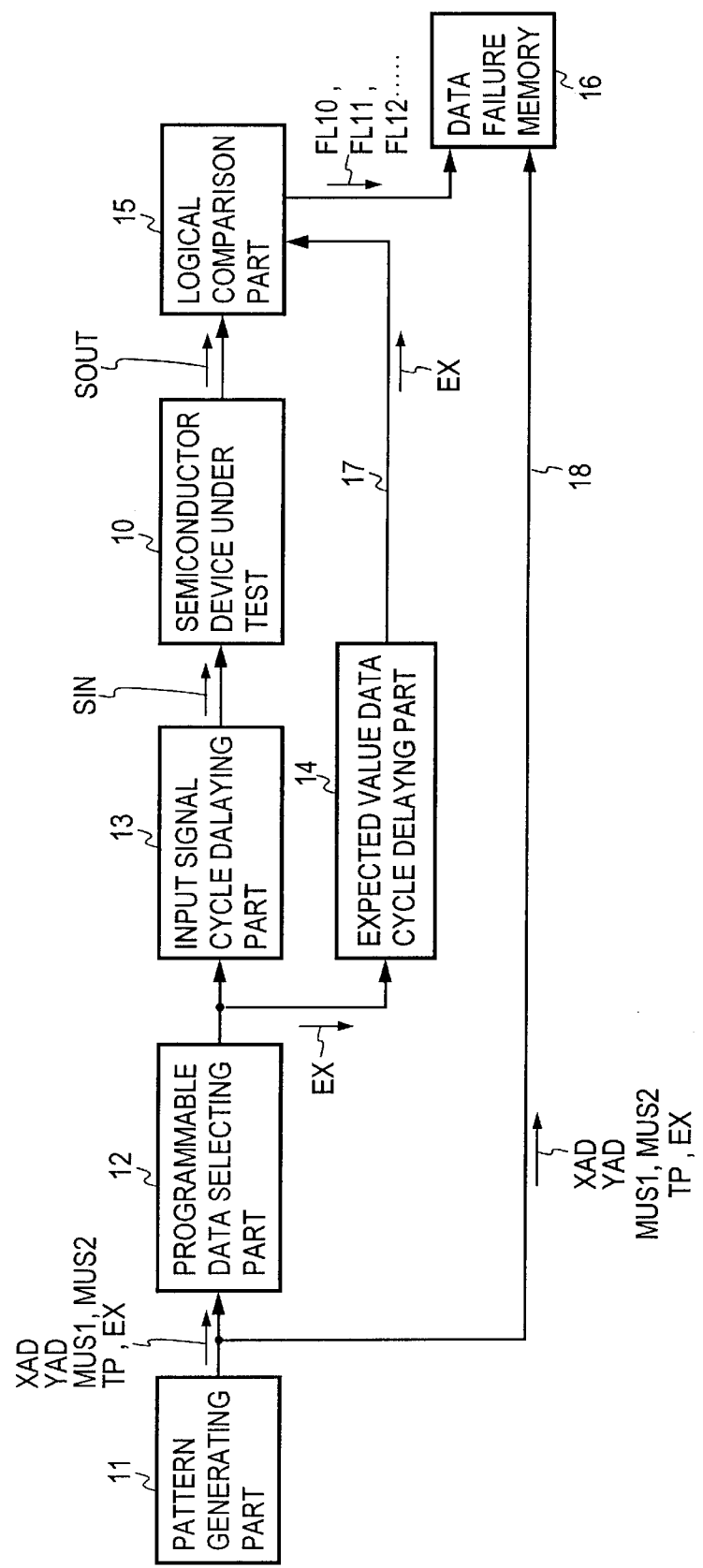
FIG. 4 is a block diagram for explaining a prior art.
Figure 5:
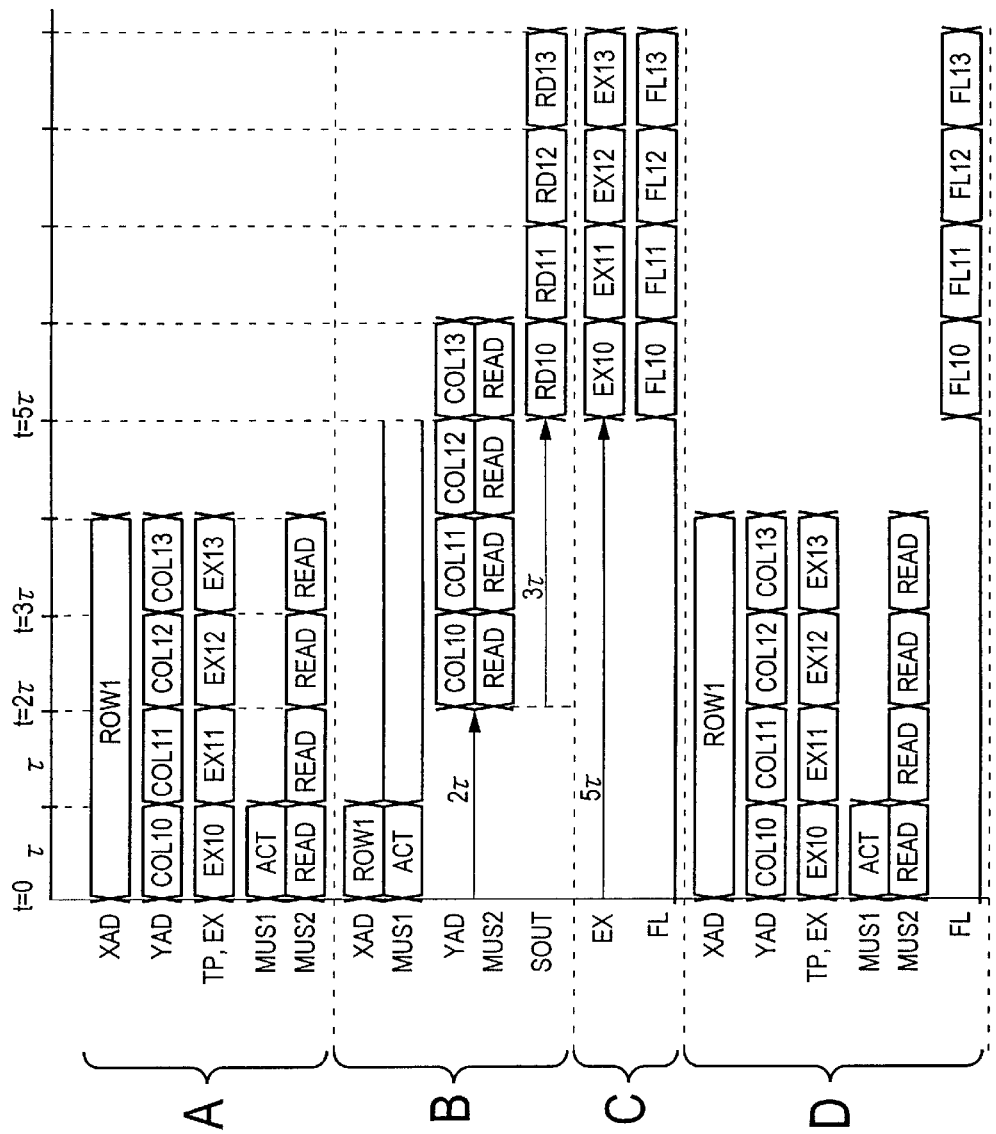
FIG. 5 is a timing chart for explaining the operation of a conventional semiconductor device testing apparatus shown in FIG. 4.

The present invention is characterized in that the semiconductor device testing apparatus is constructed by adding a variable delay part 19 to the semiconductor device testing apparatus having a configuration shown in, for example, FIG. 4.

The variable delay part 19 is inserted in a data transmission path 18 for transmitting various data and signals outputted from the pattern generating part 11 to the data failure memory 16. The variable delay part 19 functions such that time delays of arbitrary test cycles can be given to respective data and signals outputted from the pattern generating part and allows the thus delayed data and signals to be transmitted to the data failure memory 16. It comprises a plurality of variable delay means 19A to 19E. The variable delay means 19A is for the X address signal XAD, the variable delay means 19B is for the Y address signal YAD, the variable delay means 19C is for the test pattern data TP containing the expected value data EX, the variable delay means 19D is for the first device control signal MUS1, and the variable delay means 19E is for the second device control signal MUS2.

Although, in this embodiment, as described above, the X address signal XAD, the Y address signal YAD, the test pattern data TP containing the expected value data EX, and the device control signals MUS1 and MUS2 are shown, however, it is within the scope of the present invention to provide, if necessary, further variable delay means may be employed for any other signals which are desired to be stored in the data failure memory 16.

By constructing the semiconductor device testing apparatus such that the respective data and signals such as the X address signal XAD, the Y address signal YAD, the test pattern data TP containing the expected value data EX, and the device control signals MWS1 and MUS2 outputted from the pattern generating part 11 are delayed by arbitrary test cycles by the corresponding variable delay means 19A–19E, these data and signals can be stored in the same address of the data failure memory 16 where a failure data FL is written at a time when the failure data FL is generated by the logical comparison part 15.

One example of the above operation will be explained below using FIGS. 2 and 3. In the example shown in FIG. 2, there is shown a case where a time delay of the same delay cycles as the delay of test cycles set in the expected value data cycle delaying part 14, i.e., a delay of five test cycles in this example, is set in each of all the variable delay means 19A–19E.

Figure 2:
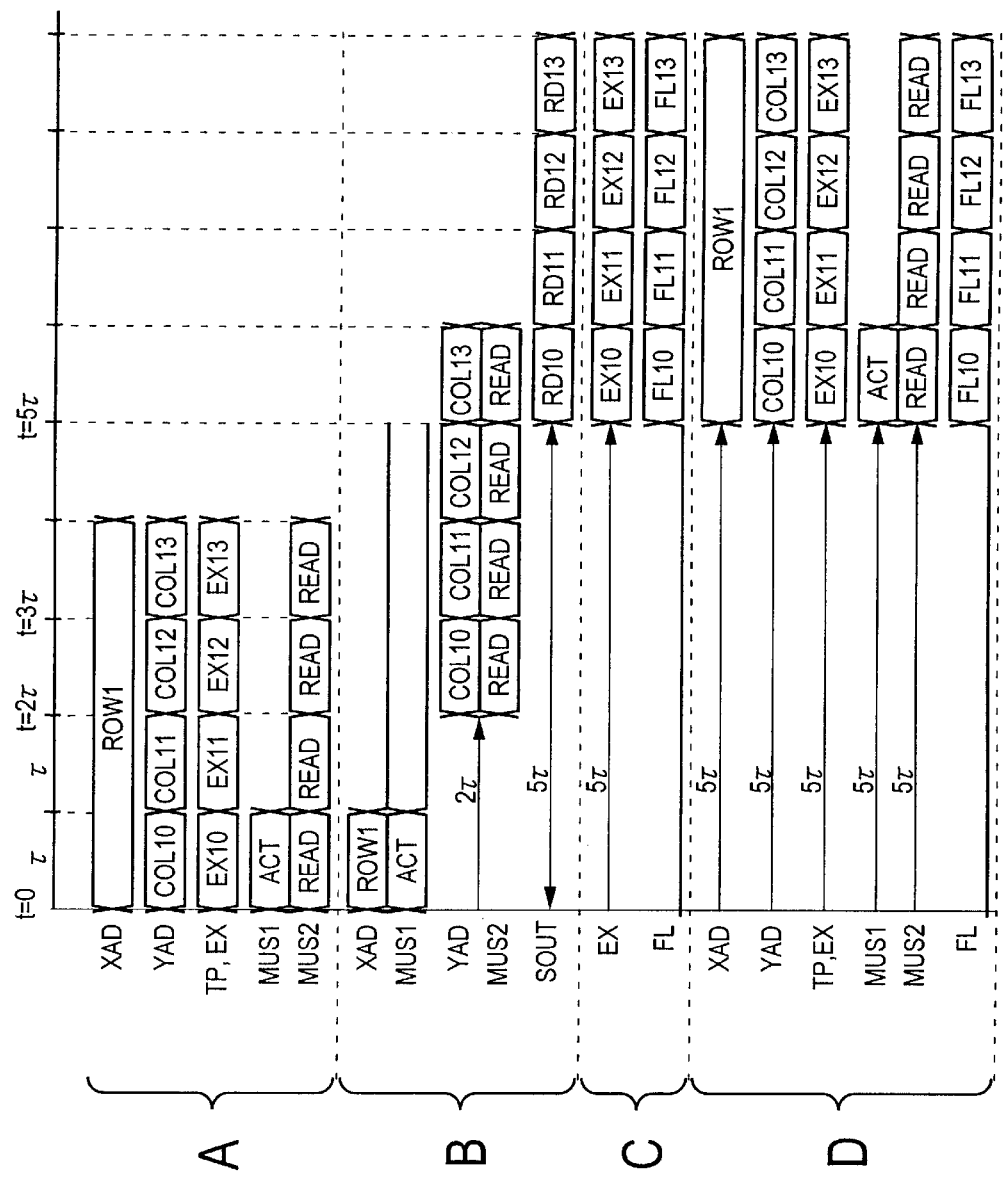
FIG. 2 is a timing chart for explaining the operation of a semiconductor device testing apparatus proposed in claim 2 of the present invention.

Therefore, as shown in D of FIG. 2, each of the data (an X address signal XAD, a Y address signal YAD, a test pattern data TP containing an expected value data EX, a first device control signal MUS1 and a second device control signal MUS2) outputted from the pattern generating part 11 is delayed by five test cycles, and is supplied to the data failure memory 16. With respect to a failure data FL10, address data ROW1, COL10 of a memory cell at which the failure occurred is stored in the data failure memory in correlation to the failure data FL 10. With respect to an expected value, an expected value EX10 to be compared with the a data read out from the address ROW1, COL10 is stored in the same address as that of the failure data FL 10. In addition, the first and second device control signals MUS1 and MUS2 are also aligned to the same timing, and are stored in the same address as that of the failure data FL 10 in the data failure memory 16.

Therefore, in this case, when the failure data FL 10 is read out from the data failure memory 16, the X address signal XAD, the Y address signal YAD and the test pattern data TP are read out together from the address where the failure data FL10 is stored. Hence, an address data of a memory cell of the semiconductor device under test 10 where a failure occurred, a test pattern data stored in the address, and the like can immediately be read out.

Figure 3:
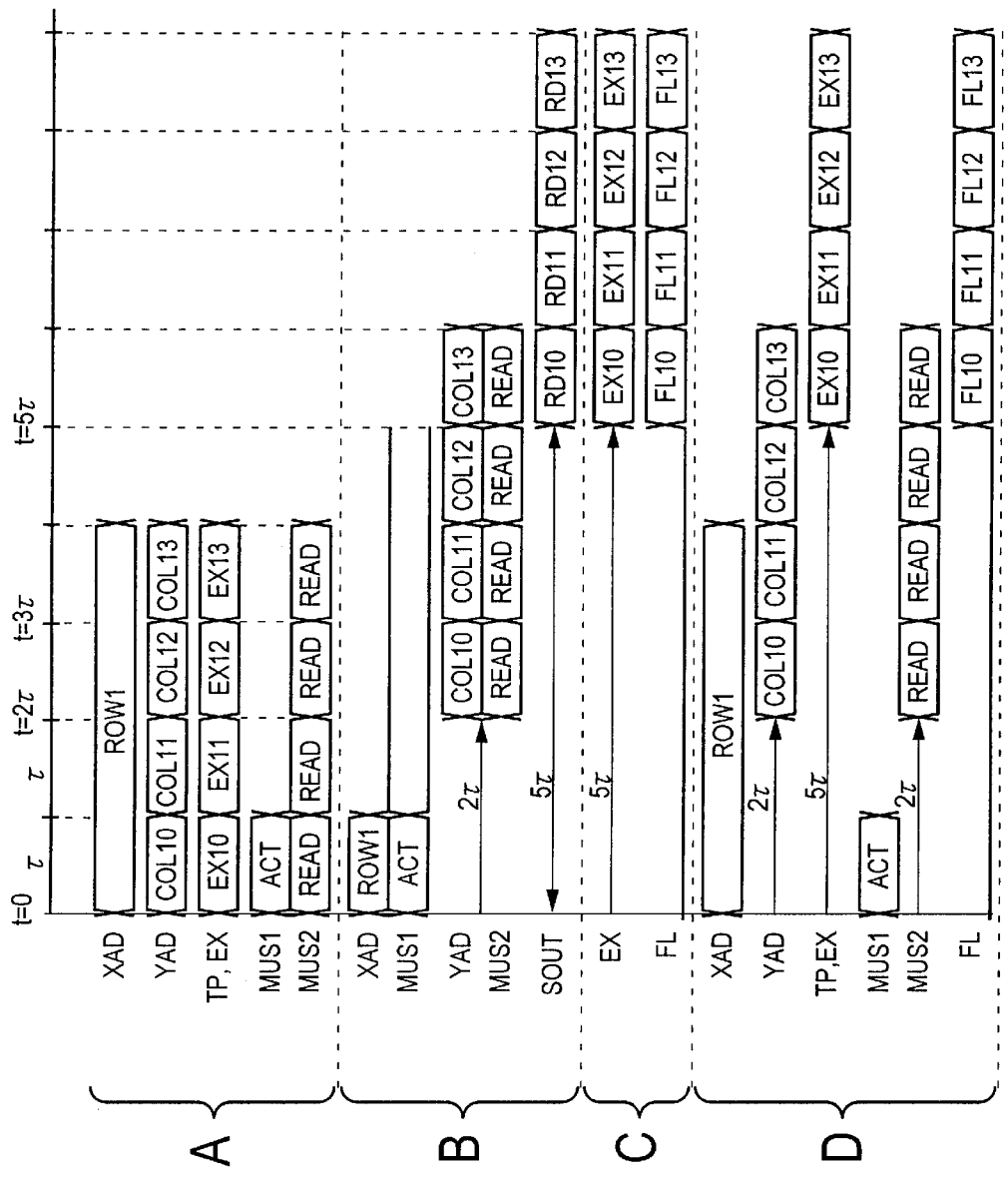
FIG. 3 is a timing chart for explaining the operation of a semiconductor device testing apparatus proposed in claim 3 of the present invention.

FIG. 3 shows a case where other different delay cycles are set in the variable delay means 19A–19E. In this example, a delay time of zero is set in each of the variable delay means 19A for delaying an X address signal XAD and the variable delay means 19D for delaying a first device control signal MUS1, a delay time of two test cycles is set in each of the variable delay means 19B for delaying a Y address signal YAD and the variable delay means 19E for delaying the second device control signal MUS2 (read command signal READ), and a delay time of five test cycles is set in the variable delay means 19C for delaying an expected value data.

By this setting situation, X address signals XAD, Y address signals YAD, first device control signals MUS1, and second device control signals MUS2 are stored in the data failure memory throughout all the cycles until a time when a discordance occurs and a failure data FL 10 is generated from the logical comparison part 15.

Therefore, in this case, by reading out the data from the data failure memory in the sequence that the data were stored, a history of the data which have been applied to the semiconductor device under test until the time of the failure occurrence can be known. Therefore, the failure cause analysis can be performed in extremely easy way compared with the case where those historical data are obtained by a searching operation performed in the conventional apparatus.

As mentioned above, according to the present invention, with respect to a failure data FL stored in the data failure memory 16, an address data of a memory cell of the semiconductor device under test 10 where the failure occurred and an expected value data can be stored in the same address where the failure data FL is stored.

In addition, according to the present invention, since address signals actually applied to the semiconductor device under test 10 and expected value data EX applied to the logical comparison part 15 can be stored until a failure occurs, there is obtained an advantage that a cause of the failure occurrence or the like can easily be analyzed by reading the stored data.

In addition, since the failure analysis can be performed using a much less expensive data failure memory 16 than an address failure memory, there is also obtained an advantage that the cost required for a semiconductor device test can be reduced.

What is claimed is:

1. A semiconductor device testing apparatus comprising:
   a pattern generating part generating an address signal, a device control signal and a test pattern data which are to be applied to a semiconductor device under test;
   a logical comparison part comparing a response output signal from said semiconductor device under test with the expected value data included in the test pattern data from said pattern generating part, and generating a failure data when a discordance occurs in the comparison;
   a data failure memory storing the failure data;
   a variable delay part provided in a data transmission path between said pattern generating part and said data failure memory and giving time delays of arbitrary test cycles to respective signals or data outputted from said pattern generating part, respectively, so that said delayed signals or data are stored in the failure memory.

2. The semiconductor device testing apparatus according to claim 1, wherein said variable delay part gives arbitrary time delay to at least the address signal, the expected value data, and the device control signal outputted from said pattern generating part, respectively.

3. The semiconductor device testing apparatus according to claim 1, wherein said variable delay part comprises a plurality of variable delay means, each of which is provided to correspond to each of at least the address signal, the test pattern data containing the expected value data, and the device control signal outputted from said pattern generating part, respectively, and gives arbitrary time delay to its corresponding signal or data, respectively.

4. The semiconductor device testing apparatus according to claim 1, wherein arbitrary time delay is set in said variable delay part such that at least an address data designating a failure memory cell where a failure occurred, a test pattern data applied to the failure memory cell, an expected value data used for the comparison with a response output data from the failure memory cell in the same address in said data failure memory which represents a position of the failure memory cell and in which the failure data is stored at a time when said logical comparison part detects a discordance in the comparison.

5. The semiconductor device testing apparatus according to claim 1, wherein arbitrary time delay is set in said variable delay part such that at least a sequence of the address data having been applied to the semiconductor device under test until a failure occurred and a sequence of the expected value data having been applied to said logical comparison part until the failure occurred are stored in said data failure memory together with the failure data representing a failure cell position where a discordance in the comparison occurred.

\* \* \* \* \*